(12) United States Patent
Dieu-Gomont et al.

(10) Patent No.: US 9,583,459 B2
(45) Date of Patent: Feb. 28, 2017

(54) METHOD FOR PRODUCING A PRINTED CIRCUIT, PRINTED CIRCUIT OBTAINED BY THIS METHOD AND ELECTRONIC MODULE COMPRISING SUCH A PRINTED CIRCUIT

(71) Applicant: Linxens Holding, Guyancourt (FR)

(72) Inventors: Severine Dieu-Gomont, Limetz-Villez (FR); Bertrand Hoveman, Eragny-sur-Oise (FR)

(73) Assignee: Linxens Holding, Guyancourt (FR)

( * ) Notice: Subject to any disclaimer, the term of this patent is extended or adjusted under 35 U.S.C. 154(b) by 0 days.

(21) Appl. No.: 14/894,558

(22) PCT Filed: May 27, 2014

(86) PCT No.: PCT/EP2014/060989
§ 371 (c)(1),
(2) Date: Nov. 30, 2015

(87) PCT Pub. No.: WO2014/191428
PCT Pub. Date: Dec. 4, 2014

(65) Prior Publication Data
US 2016/0105961 A1    Apr. 14, 2016

(30) Foreign Application Priority Data

May 30, 2013   (FR) ...................... 13 54965

(51) Int. Cl.
*H01L 23/00* (2006.01)
*H01L 23/498* (2006.01)
(Continued)

(52) U.S. Cl.
CPC ......... *H01L 24/85* (2013.01); *H01L 23/49855* (2013.01); *H01L 24/49* (2013.01);
(Continued)

(58) Field of Classification Search
CPC ......... H05K 3/421; H05K 3/328; H01L 24/85; H01L 2924/18165
(Continued)

(56) References Cited

U.S. PATENT DOCUMENTS 6,117,706 A    9/2000   Yoshioka et al. ............. 438/106
6,288,904 B1   9/2001   Houdeau et al. ............. 361/760
(Continued)

FOREIGN PATENT DOCUMENTS

CN    102999778 A    3/2013
CN    103020694 A    4/2013
(Continued)

*Primary Examiner* — Jeremy C Norris
(74) *Attorney, Agent, or Firm* — Harrington & Smith (57) ABSTRACT

The invention concerns a method for producing a printed circuit for a chip card module. This method involves producing two layers of electrically conductive material insulated from each other by a layer of insulating material, connection holes extending through the layer of insulating material and blocked by one of the layers of electrically conductive material, an area free of conductive material being provided in the other layer of electrically conductive material around the connection holes. The invention also concerns a printed circuit for a chip card produced using this method and a chip card module including such a printed circuit.

12 Claims, 5 Drawing Sheets

(51) Int. Cl.
*H05K 1/02* (2006.01)
*H05K 3/06* (2006.01)
*H05K 3/28* (2006.01)
*G06K 19/077* (2006.01)
*H05K 1/11* (2006.01)

(52) U.S. Cl.
CPC ........... *H05K 1/028* (2013.01); *H05K 1/0296* (2013.01); *H05K 1/115* (2013.01); *H05K 3/06* (2013.01); *H05K 3/28* (2013.01); *G06K 19/07769* (2013.01); *H01L 2224/48091* (2013.01); *H01L 2224/48227* (2013.01); *H01L 2224/48228* (2013.01); *H01L 2224/49109* (2013.01); *H01L 2224/85002* (2013.01); *H01L 2924/00014* (2013.01); *H05K 1/11* (2013.01); *H05K 2201/0394* (2013.01); *H05K 2201/095* (2013.01); *H05K 2201/09509* (2013.01)

(58) Field of Classification Search
USPC .......................................................... 438/617
See application file for complete search history.

(56) References Cited

U.S. PATENT DOCUMENTS

| | | | |
|---|---|---|---|
| 6,310,778 B1 | 10/2001 | Finn et al. | 361/737 |
| 8,030,746 B2 * | 10/2011 | Tan | G06K 19/072 |
| | | | 257/686 |
| 2012/0248201 A1 | 10/2012 | Sutera | 235/492 |

FOREIGN PATENT DOCUMENTS

| | | |
|---|---|---|
| DE | 19931694 A1 | 1/2001 |
| FR | 2 765 010 | 12/1998 |
| JP | H-06152143 A | 5/1994 |
| JP | 2008098482 A | 4/2008 |
| WO | WO-2005125292 A1 | 12/2005 |

* cited by examiner

METHOD FOR PRODUCING A PRINTED CIRCUIT, PRINTED CIRCUIT OBTAINED BY THIS METHOD AND ELECTRONIC MODULE COMPRISING SUCH A PRINTED CIRCUIT

The invention relates to the field of printed circuits. Such printed circuits can be used for example for producing electronic modules for Smart Card, RFID antennas, Light Emitting Diodes.

The invention is illustrated below using the example of electronic modules for smart cards, but it is easily transferable to other applications of printed circuits including those above mentioned.

Smart cards are well known to the public, which has multiple uses: credit cards, SIM cards for mobile phones, transportation cards, identity cards, etc.

Smart cards are generally composed of a rigid plastic substrate type PVC, PVC/ABS or polycarbonate constituting the most of the card, in which is incorporated an electronic module manufactured separately. The electronic module includes a printed circuit generally flexible equipped with an electronic chip (integrated circuit) and transmission means for transmitting the data from the chip to a card reader device (reading) or from the device to the card (writing). These means of data transmission may be with "contact", "contactless" or "dual" when combining both "contact and contactless" modes.

In a "contact" smart card, a connector has contact areas electrically connected to the chip and flush with the electronic module at the surface of the substrate, for a connection by electrical contact with a card reader device. In a "contactless" smart card, the data is transmitted to the chip through a radio frequency system operating between an antenna located into the reader and an antenna located in the card itself. In a "dual" smart card, the means of transmission are both "contact" and "contactless", the electronic module having a flexible circuit equipped of a single electronic chip that can manage the two data transmission modes.

Hereinafter, we are especially interested in printed circuits having several layers of electrically conductive material isolated one from each other by a layer of insulating material. More particularly, we will focus on such printed circuits in which bonding holes (via holes) are formed in the layer of insulating material. These circuits are, for example double sided or multilayer circuits in which patterns, such as conductive tracks, electrical contacts, an antenna, or combinations of these different patterns, are etched in at least one of the layers.

One of the advantages of a bonding hole is to allow notably the passage of a conductive wire through the insulating material layer. Indeed, one of the layers of electrically conductive material may be used to connect a chip or a diode to a contact pad which is located on one side of the printed circuit opposite to that on which the chip is located. Either the conductive wire is connected (for example by wire bonding) to a track or a pad of a layer of electrically conductive material which is on the periphery of a bonding hole. Or the conductive wire is directly connected to a part of a layer of electrically conductive material which partially closes at least the bonding hole. In this case, the surface of this layer located in front of bonding hole may be used to connect therein one extremity of the wire, while the other extremity is connected to an electronic component such as a chip or a diode.

A problem encountered with prior art circuits is that pattern manufacturing in a layer of conductive material other than the one closing the bonding holes leads to the formation of rings of electrically conductive material around the bonding holes. Indeed, the pattern manufacturing in a layer of conductive material other than the one closing the bonding holes requires an etching step. Therefore, the bonding holes must be closed during the etching step to protect the layer of electrically conductive material sealing holes (at least partially). To ensure that the etching liquid will not penetrate into the bonding holes, a ring of photosensitive resin of some microns, 50 to 250 microns is maintained around each bonding hole. Under these rings, the layer of electrically conductive material will not be removed and rings of electrically conductive material thus remain around the bonding holes. Such rings can become problematic if an electrical contact is established between one of them and a connection wire.

One target of the invention is to overcome this problem at least partially.

That is why, it is proposed according to the invention a manufacturing process of a printed circuit including the manufacturing of a composite comprising a first and a second layers of electrically conductive material attached to an insulating substrate. These layers of electrically conductive material can cover the two main surfaces of an insulating substrate to form a double sided printed circuit. They also can provide two layers of a multilayer printed circuit (with more than two layers of electrically conductive material). In this case, they can be in an intermediate composite (with two layers of electrically conductive material insulated from one another by an insulating substrate) on which one or several other insulating or conductive layers will be stacked or in a composite already including more than two layers of electrically conductive material. In the process according to the invention, the order of steps for the manufacturing of the first and second layers of electrically conductive material is not always appropriate. In some cases, the first layer of electrically conductive material may be performed before or after the second layer of electrically conductive material. In some other cases, steps of the process according to the invention may be interposed between those of manufacturing of the first and second layers of conductive material. The terms "first" or "second" does not necessarily refer to the chronological order of steps.

The composite with the first and second layers of electrically conductive material insulated from one another by a layer of insulating material also includes at least one bonding hole going through a layer of insulating material. Each bonding hole extends in the insulating substrate between a bottom at least partially closed by the first layer of conductive material and an opening into a side of the substrate. For example, the first layer of conductive material is deposited on one of the sides of the insulating substrate, which had previously been punched to form bonding holes. Therefore, the first layer of conductive material closes up the bonding holes. The side of this first conductive layer coated and/or laminated onto the substrate then forms the bottom of the bonding holes. The first layer of conductive material may be a conductive grid (lead frame). The opposite extremity of a bonding hole, opposite to that forming the bottom is designed to remain open to allow subsequent passage of a connecting wire.

The process according to the invention also includes the manufacturing, by photolithography and etching, of patterns on the second layer of electrically conductive material. These patterns may be for example, if electrical contacts are etched into the first layer of conductive material (constituting then the contact side of a double-sided circuit for smart card module), etched conductive tracks and/or antenna in the second layer of conductive material.

The process according to the invention moreover includes a protection operation of the bonding hole. This operation is necessary as explained above to protect the first layer of electrically conductive material during the etching of patterns in the second layer of electrically conductive material. This protection can be realized in many ways: coating a resin to fill up the bonding holes, deposition of a photosensitive compound by electrophoresis or inkjet method, etc. . . . . In all cases we use a soluble material in order to be able to remove it later to clear bonding holes and to be able to use them for the passage of the connection wires.

According to the invention, the protection of the bonding hole by a soluble material is performed during a distinct step of producing patterns on the second layer of electrically conductive material. Thus, it is possible to protect the bonding holes with another material than the photosensitive film defining the patterns of the second layer of electrically conductive material. By removing this constraint, it also becomes possible to treat the protection of bonding holes and the patterns manufacturing by steps or by a series of specific steps. Notably, during the patterns manufacturing on the second layer of electrically conductive material, we can clear or leave cleared an area of at least 10 microns around bonding holes, at the second layer of electrically conductive material, which be devoid of electrically conductive material.

The wires connected to the bottom of bonding holes will not risk touching conductive rings remaining around the edge of the bonding holes anymore.

Following a first scenario, the patterns are made by photolithography on the first layer of electrically conductive material after bonding and/or lamination of the first layer of electrically conductive material on the insulating substrate. The protecting operation of bonding holes is then made after the patterns manufacturing on the second layer of electrically conductive material. In this case, the bonding holes may also be punched in the substrate of insulating material after the patterns manufacturing on the second layer of electrically conductive material and before bonding and/or laminating the first layer of electrically conductive material on the insulating substrate (in this document when the term "to laminate" or "laminated" is used, it will be with reference to a layer which is either simply laminated or bonded and laminated).

According to another scenario, the protection operation of the bonding holes is made before the patterns manufacturing on the second layer of electrically conductive material. Patterns may then be made during the same steps on the first and second layers of electrically conductive material. The soluble material used for the protection of the bonding holes may be a resin and a step of micro-development may precede the patterns manufacturing on the first and second layers of electrically conductive material.

Following an another aspect, the invention relates to a printed circuit obtained by the process mentioned above. This printed circuit then includes a composite with:
 A first and second layers of electrically conductive material, attached to an insulating substrate,
 At least a bonding hole extending in the insulating substrate between a bottom at least partially closed by the first layer of conductive material and an opening into one side of the substrate, and
 Etched patterns in the second layer of electrically conductive material.

Moreover, it includes an area of at least 10 microns around the bonding hole devoid of electrically conductive material of the second layer of electrically conductive material.

According to another aspect, the invention relates to a smart card module including a printed circuit as defined above.

Other specifications and advantages of the invention will appear upon the reading of the detailed description and attached drawings in which.

Several means for implementing of the process according to the invention are described below. All belong to the field of smart card, but as has already been mentioned applications in other fields (RFID antennas, LEDs, etc.) are easily transferable.

Figure 1:
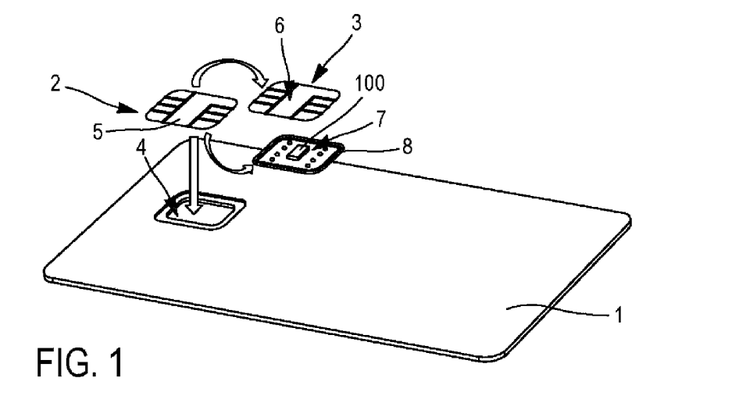
FIG. 1 shows a schematic perspective view of a smart card to receive a printed circuit according to the invention.

As shown in FIG. 1, a smart card 1 has a module 2. A module 2 comprises a printed circuit 3 and a chip 100. Module 2 is generally made as a separate element which is inserted into a cavity 4 arranged in the card 1.

The printed circuit 3 has got several contacts 5 to which is connected the chip 100. The printed circuit 3 is represented (on the top) view of its front side 6 (contact side). It is also represented (at the bottom) view of its rear side 7. The shown printed circuit 3 corresponds to a double-sided printed circuit for "dual" card, with contacts 5 on the front side 6 and an antenna 8 on the rear side 7.

Figure 2A:
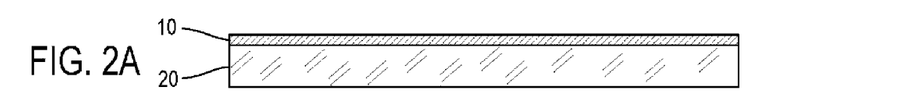
FIGS. 2A to 2N show schematically the different steps of an example of process according to the invention.
Figure 2B:
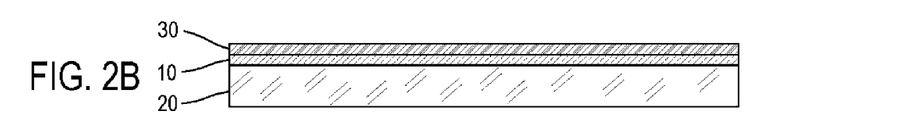
Figure 2C:
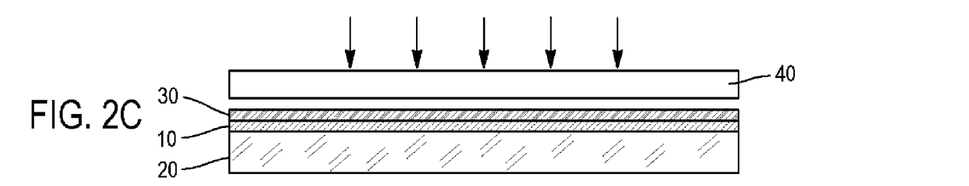
Figure 2D:
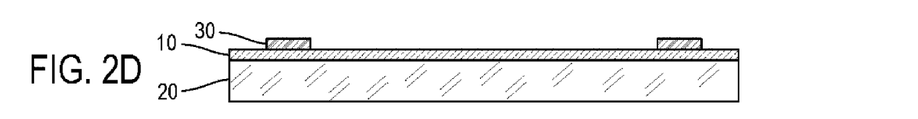
Figure 2E:
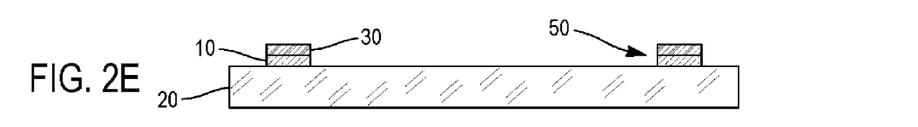
Figure 2F:
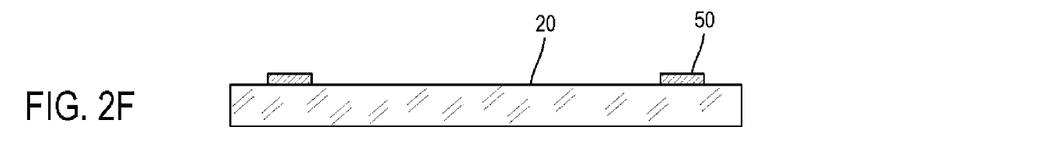
Figure 2G:
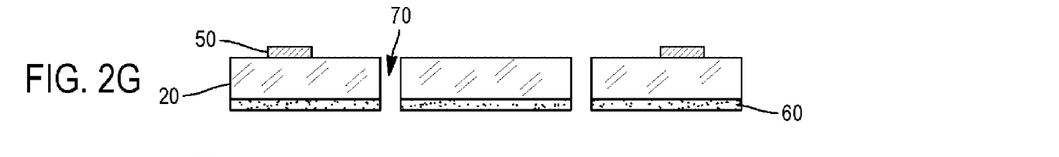
Figure 2H:
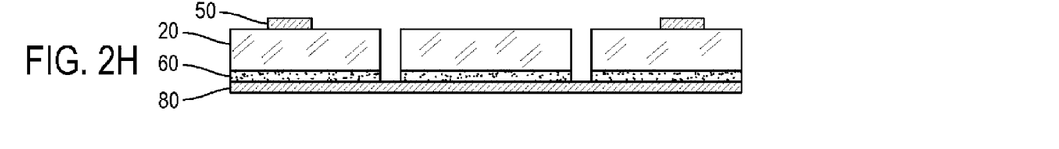
Figure 2I:
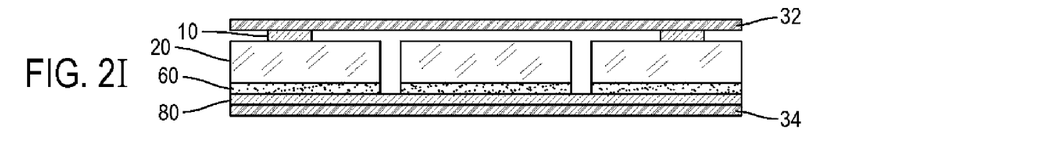
Figure 2J:
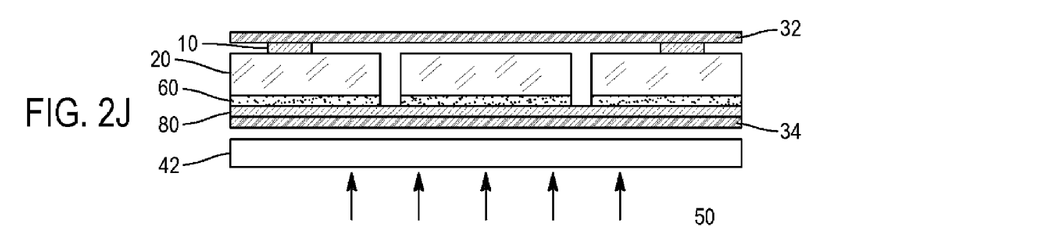
Figure 2K:
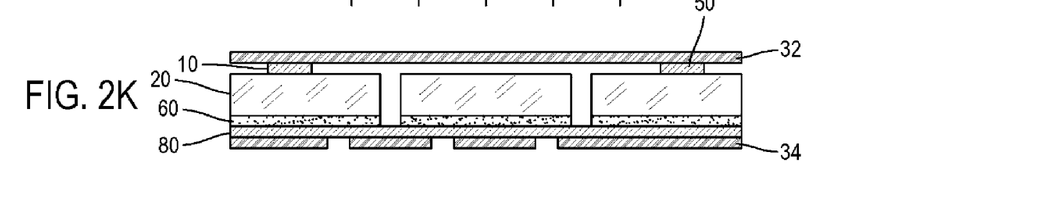
Figure 2L:
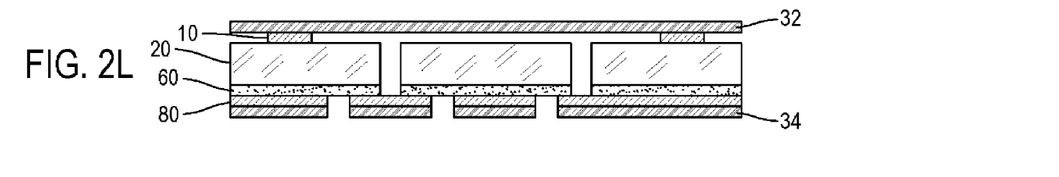
Figure 2M:
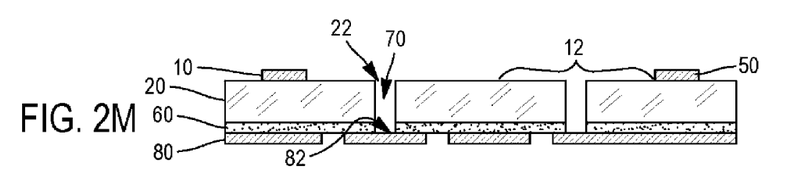
Figure 2N:
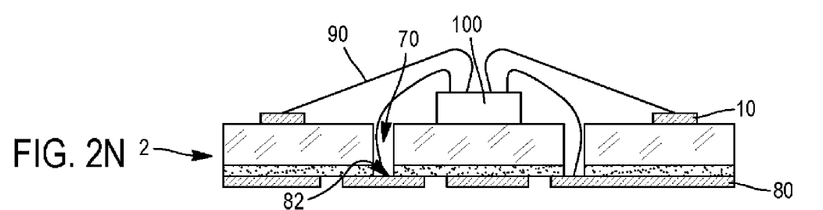

The FIGS. 2A to 2N schematically illustrate different steps of an example of process according to the invention for the manufacture of printed circuit 3.

As shown in FIG. 2A, there is provided a structure comprising a layer of electrically conductive material 10 laminated on a substrate layer of electrically insulating material 20. The electrically conductive material 10 may be a metal such as copper, steel, aluminum or an alloy thereof. The thickness of the layer of electrically conductive material 10 is, for example, 18 μm or 25 μm. The insulating material 20 may be a composite type of dielectric material (glass-epoxy) or a plastic (PET, PEN, polyimide, etc.). The insulating material substrate 20 is generally thin (its thickness is for example of the order of 100 microns) to maintain a flexibility compatible with continuous manufacturing processes of electronic modules 3. The assembly composed of insulating material substrate 20 covered with the electrically conductive material layer 10 forms a flexible circuit. The layer of conductive material 10 and the substrate of insulating material 20 form a stratified composite also called "copper clad" according to English terminology (if the layer of conductive material 10 consists essentially of copper).

In the next step, shown in FIG. 2B, a film or a layer of photosensitive resin 30 is laminated or coated on the surface of the layer of electrically conductive material 10.

This photosensitive resin film 30 is then exposed through a mask 40 (FIG. 2C) and developed (FIG. 2D), to leave the resin on the areas of the layer of electrically conductive material 10 which are destined to become patterns 50 (conductive tracks, antenna, etc.).

After etching (FIG. 2E), the insulating material substrate 20 is again bare except on areas destined to become patterns

50. The protective resin 30 is then removed to allow the patterns 50 to be bare (FIG. 2F).

In a step not shown, an adhesive material layer 60 (having a thickness for example of the order of 20 µm) is deposited on the side of the insulating material substrate 20 opposite to that bearing the patterns 50.

Bonding holes 70 are then punched through the insulating material substrate 20 and the adhesive layer 60 (FIG. 2G). Then, another layer of electrically conductive material 80 is laminated on the adhesive material layer 60 (FIG. 2H). This new layer of electrically conductive material 80 may consist of one of the materials already mentioned above to form the previous layer of electrically conductive material 10. As illustrated, the bonding holes 70 are covered and closed at one of their extremities, by the new layer of electrically conductive material 80.

At the step shown in FIG. 2I, two photosensitive resin films 32, 34 are each respectively coated or laminated on one side of the composite consisting of the two electrically conductive layers 10, 80 and the insulating material substrate 20.

One (34) of the two photosensitive resin films 32, 34 is then exposed through a mask 42 (FIG. 2J) then developed (FIG. 2K), to leave the resin on the areas of the electrically conductive layer 80 which are intended to become patterns 50 (conductive tracks, antenna, etc.).

After etching (FIG. 2L) and removal of the two photosensitive resin films 32, 34 (FIG. 2M), a printed circuit comprising a composite is obtained with:

A first 80 and second 10 layers of electrically conductive material, attached to an insulating substrate 20, At least one bonding hole 70 extending in the insulating substrate 20, between a bottom 82 at least partially closed by the first layer of conductive material 80 and an opening 22 opening into one side of the insulating substrate 20, and etched patterns 50 in the second layer of electrically conductive material 10.

The composite includes an area 12 of at least 10 microns around the bonding hole 70 devoid of the electrically conductive material of the second layer 10 of electrically conductive material.

This composite can be used to produce a module 2 (FIG. 2N), wherein the connection wires 90 are welded at the bottom 82 of the bonding holes 70, by one of their extremities to the bonding side of the first layer of electrically conductive material 80, while the other end is welded to the chip 100.

The FIGS. 3A to 3I schematically illustrate different steps of another example of process according to the invention for the manufacture of the printed circuit 3.

Figure 3A:
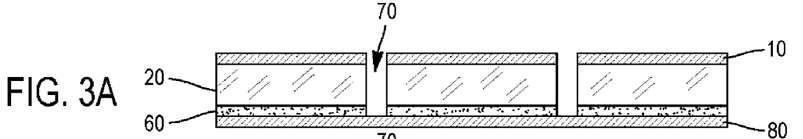
FIGS. 3A to 3I show schematically the different steps of another example of process according to the invention.

As shown in FIG. 3A, there is provided a structure comprising two layers 10, 80 of electrically conductive material laminated on a substrate 20 of electrically insulating material. The nature and thicknesses of the electrically conductive and electrically insulating materials may be similar to those of the materials mentioned in connection with the mode of implementation of the above method. The structure of FIG. 3A is substantially the same as that of FIG. 2H. The difference is mainly due to the fact that the second layer of electrically conductive material 10 does not yet include the patterns 50.

Figure 3B:
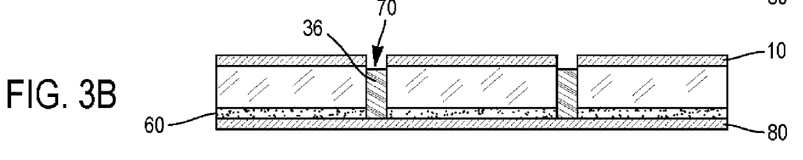

In the next step, illustrated in FIG. 3B, the bonding holes 70 are protected by a resin 36. This resin 36 may be dispensed or deposited in the bonding holes 70 by coating, inkjet or electrophoresis. The resin 36 is resistant to etching baths usually used for the manufacture of printed circuits. It may be photosensitive or not.

Figure 3C:
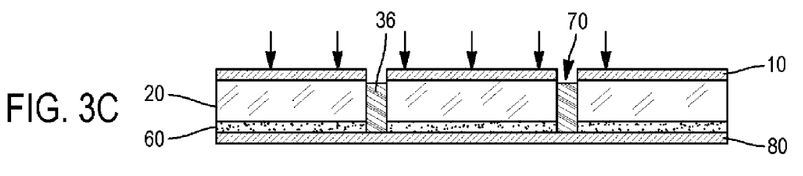

The photosensitive resin 36 may then undergo a micro-development (3C).

In point of fact, according to the resin 36 depositing method in the bonding holes 70, a small thickness can remain on the surface of the second layer of electrically conductive material 10. This residual deposit is removed by a step of micro-development leaving the surface of the second layer of electrically conductive material 10 clean. The nature of this micro-development depends on the resin 36. It may be chemical for example.

Figure 3D:
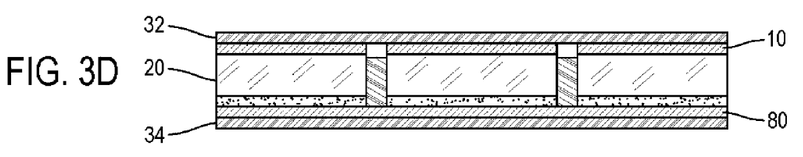

In the step shown in FIG. 3D, two photosensitive resin films 32, 34 are each respectively applied to one side of the composite composed of the two electrically conductive layers 10, 80 and the insulating material substrate 20.

The resin 36 must not be soluble in development baths of resins 32, 34.

The two photosensitive resin films 32, 34 are then exposed through masks 40, 42 (FIG. 3E), and then developed (FIG. 3F) to leave resin 32, 34 on the areas of the layers of electrically conductive material 10, 80 of electrically conductive material destined to become patterns 50 (contacts, conductive tracks, antenna, etc.).

After etching (FIG. 3G) and removing of the two photosensitive resin films 32, 34 and resin 36 (FIG. 3H), a printed circuit including an identical composite to that of FIG. 2M is obtained.

As before, this composite may be used to produce a module 2 (FIG. 3I) similar to that of FIG. 2N.

Figure 3E:
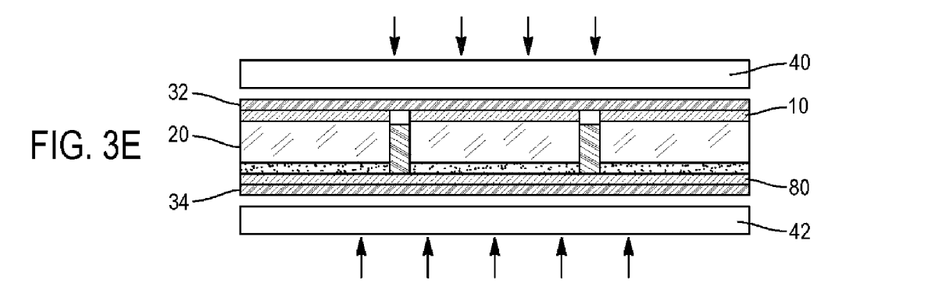
Figure 3F:
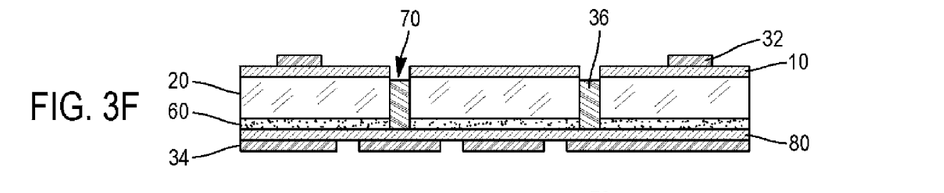
Figure 3G:
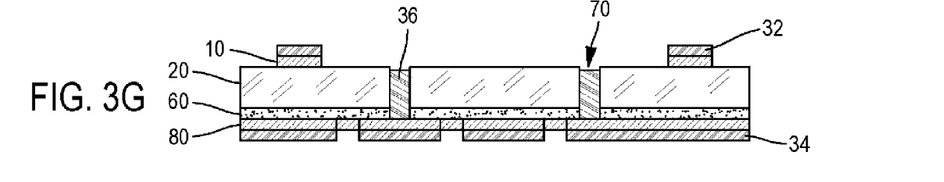
Figure 3H:
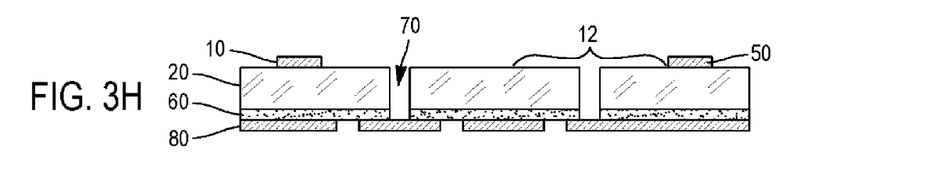
Figure 3I:
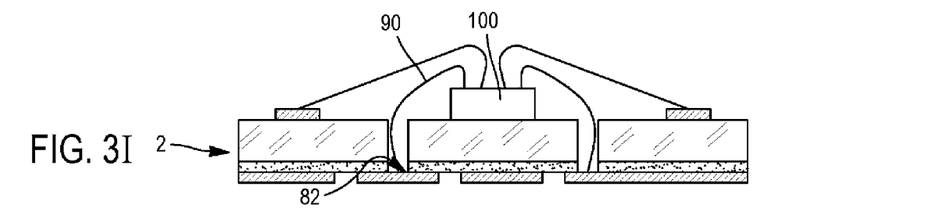

Alternatively, the photosensitive resin 36 is applied by electrophoresis on all conductive surfaces. Therefore there is resin 36 in the holes and on each of the sides of the first 80 and second 10 conductive material layer. A step of micro-development allows removing the resin 36 on the side of the second layer 10 of conductive material. On the other hand, resin 36 remains on the first layer 80 of conductive material. A film or resin of an opposite polarity to the resin 36 (positive or negative) is then applied to the surface of the second layer 10 of electrically conductive material. Then, the steps 3E and the following steps are implemented.

The module 2 obtained by one or the other modes of implementation presented above is compatible with the common processes and techniques of continuous assembly of smart card modules (die-attach, wire-bonding, UV or thermal encapsulation) and with the usual processes of inserting modules in the cards bodies.

FIGS. 4A to 4F schematically illustrate various steps of another exemplary method according to the invention for the fabrication of the printed circuit 3.

Figure 4A:
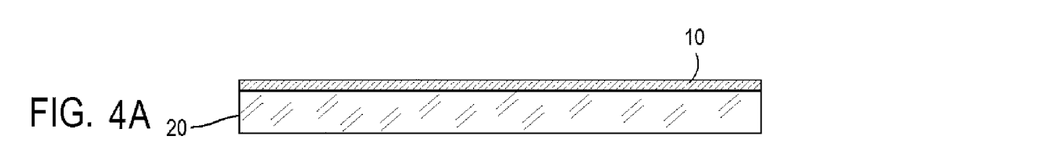
FIGS. 4A to 4F show schematically the different steps of yet another example of process according to the invention.

As represented in FIG. 4A, a structure is provided comprising a layer 10 of electrically conductive material laminated on an electrically insulating material substrate 20. The nature and the thicknesses of the electrically conductive materials can be similar to those of the materials mentioned in conjunction with the modes implemented described previously. The side of the electrically insulating material substrate 20 opposite to that comprising the layer 10 of electrically conductive material thereafter receives an adhesive layer 60.

Figure 4B:
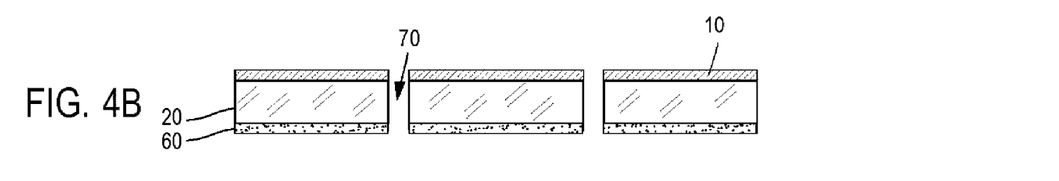

In the following step, illustrated by FIG. 4B, bonding holes 70 are produced, for example by perforation, over the entire thickness of the previous structure. Two films, respectively 32i and 34i are thereafter disposed (for example by coating or lamination) on the conductive layer 10 on the one hand and on the adhesive material layer 60 on the other hand (see FIG. 4C). The film 32i is a photosensitive resin film.

Figure 4C:
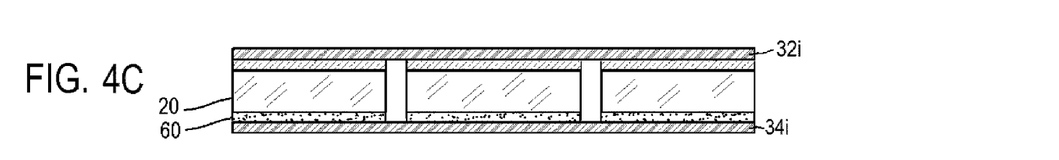

The film 34*i* is a protective film for the adhesive layer 60. It may be a photosensitive or non-photosensitive resin.

A succession of steps, non-represented, (irradiation and exposure of the photosensitive film 32*i* and chemical etching of the conductive layer 10 according to the patterns exposed in the photosensitive resin film 32*i*) are thereafter carried out so as to lay bare the insulating substrate 20, over at least 10 μm around the bonding wells 70. For example, the areas thus laid bare correspond to annuli (see FIG. 4D).

Figure 4D:
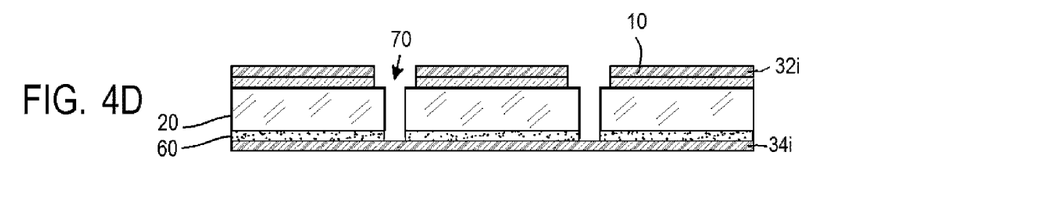

The films 32*i*, 34*i* are thereafter eliminated (for example the photosensitive resin film 32*i* is dissolved, while the film 34*i* is peeled off. Next, a second conductive layer 80 is laminated on the side of the insulating substrate 20 opposite to that on which the conductive material has been removed from the periphery of the bonding holes.

Figure 4E:
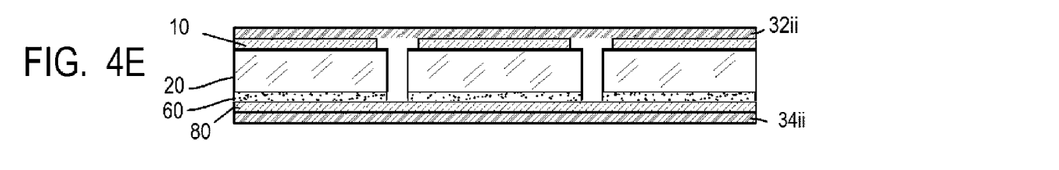

Two other photosensitive resin films 32*ii*, 34*ii* are each respectively applied (by coating or lamination) on a conductive layer 10, 80 (see FIG. 4E).

Figure 4F:
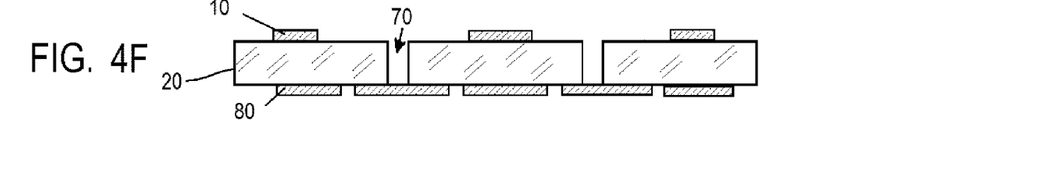

The two sides then undergo, for example simultaneously, steps of irradiation, and of exposure of the photosensitive films 32*ii*, 34 and of chemical etching of the conductive layers 10, 80 according to the patterns desired for each of the sides. The photosensitive films 32*ii*, 34*ii* are thereafter dissolved and the structure obtained is substantially equivalent to the composites already described in conjunction with FIGS. 2M and 3H.

As previously, this composite can be used to produce a module 2 similar to that of FIG. 2N.

The invention claimed is:

1. A method for fabricating a printed circuit for smart card electronic module comprising
    the production of a composite comprising a first and a second layers of electrically conductive material, attached to an insulating substrate and furthermore comprising at least one bonding hole extending in the insulating substrate between a bottom at least partially closed by the first layer of conductive material and an opening opening into one side of the insulating substrate, and
    the production by photolithography and etching of patterns on the second layer of electrically conductive material,
    characterized by the fact that it furthermore comprises an operation of protecting the bonding hole with a soluble material during a step distinct from the production of patterns on the second layer of electrically conductive material and by the fact that the production of patterns on the second layer of electrically conductive material leaves an area of at least ten microns around the bonding hole devoid of the electrically conductive material of the second layer of electrically conductive material.

2. The method as claimed in claim 1, in which the operation of protecting the bonding hole is carried out after the production of patterns on the second layer of electrically conductive material.

3. The method as claimed in claim 1, in which the bonding hole is produced by perforation of the insulating substrate after the production of patterns on the second layer of electrically conductive material.

4. The method as claimed in claim 3, in which the first layer of electrically conductive material is laminated on the insulating substrate after the production of the bonding hole by perforation of the insulating substrate.

5. The method as claimed in claim 4, in which patterns are produced by photolithography on the first layer of electrically conductive material after lamination of the first layer of electrically conductive material on the insulating substrate and therefore after perforation of the bonding hole.

6. The method as claimed in claim 1, in which the bonding hole is produced by perforation of the insulating substrate before the production of patterns on the second layer of electrically conductive material.

7. The method as claimed in claim 1, in which the operation of protecting the bonding hole is carried out before the production of patterns on the second layer of electrically conductive material.

8. The method as claimed in claim 1, in which patterns are produced in the course of the same steps on the first and the second layers of electrically conductive material.

9. The method as claimed in claim 1, in which the soluble material is a resin.

10. The method as claimed in claim 9, in which a micro-development step precedes the production of the patterns on the first and the second layers of electrically conductive material.

11. A printed circuit for an electronic module of a smart card including a composite with
    a first and a second layers of electrically conductive material, attached to an insulating substrate,
    at least one bonding hole extending in the insulating substrate between a bottom at least partially closed by the first layer of conductive material and an opening opening into one side of the insulating substrate, and
    etched patterns in the second layer of electrically conductive material, characterized by the fact that it includes an area of at least ten microns around the bonding hole devoid of the electrically conductive material of the second layer of electrically conductive material.

12. An electronic module for a smart card, comprising a flexible printed circuit including a composite with
    a first and second layers of electrically conductive material, attached to an insulating substrate,
    at least one bonding hole extending in the insulating substrate between a bottom at least partially closed by the first layer of conductive material and an opening opening into one side of the insulating substrate, and
    etched patterns in the second layer of electrically conductive material, characterized by the fact that it includes an area of at least ten microns around the bonding hole devoid of the electrically conductive material of the second layer of electrically conductive material.

\* \* \* \* \*